US005752175A

United States Patent [19]
Roullet et al.

[11] Patent Number: 5,752,175
[45] Date of Patent: May 12, 1998

[54] FREQUENCY SYNTHESIZER FOR V/UHF WIDEBAND RECEIVER

[75] Inventors: André Roullet, Domont; Daniel Peris, Colombes, both of France

[73] Assignee: Thomson-CSF, Paris, France

[21] Appl. No.: 572,627

[22] Filed: Dec. 14, 1995

[30] Foreign Application Priority Data

Dec. 16, 1994 [FR] France .................................. 94 15169

[51] Int. Cl.[6] .................................................. H04B 1/18
[52] U.S. Cl. .................................. 455/183.1; 455/190.1; 455/264; 455/315
[58] Field of Search .................................. 455/314, 315, 455/180.3, 183.1, 190.1, 260, 188.2, 76, 259, 265, 264; 331/158

[56] References Cited

U.S. PATENT DOCUMENTS 4,492,936 1/1985 Albarello et al. .
4,792,914 12/1988 Dartois et al. .
4,896,338 1/1990 Rouillet et al. .
5,122,762 6/1992 Molina et al. .
5,179,729 1/1993 Mishima et al. ........................ 455/260

FOREIGN PATENT DOCUMENTS 0 385 181 9/1990 European Pat. Off. .
0 434 527 6/1991 European Pat. Off. .
0 538 903 4/1993 European Pat. Off. .
WO 84/04637 11/1984 WIPO .

Primary Examiner—Andrew Faile
Assistant Examiner—Christopher Onuaku
Attorney, Agent, or Firm—Oblon, Spivak, McClelland, Maier & Neustadt, P.C.

[57] ABSTRACT

The device includes a first frequency synthesizer loop with fractional division to a apply a first wide frequency band transposition signal to an input of the first mixing stage of the receiver, a second phase-lock frequency synthesizer loop to apply a second narrow frequency band transposition signal to an input of the second mixer stage of the receiver and a common frequency source coupled to the first loop and to the second loop for the application, to their reference inputs, of a frequency reference signal. Application to wideband (20 MHz to GHz) V/UHF receivers.

12 Claims, 2 Drawing Sheets

| SUB-RANGE | FA (MHz) | F$_T$ (MHz) | FOL 1 (MHz) | FINDRV (MHz) |
|---|---|---|---|---|
| 1 | 20 - 130 | 5120 | 4503 - 4613 | 617 - 507 |
| 2 | 130 - 1140 | 6144 | 4613 - 5623 | 1531 - 521 |
| 3 | 1140 - 2160 | 5120 | 5623 - 6643 | 503 - 1523 |
| 4 | 2160 - 3000 | 6144 | 6643 - 7483 | 499 - 1339 |
FIG.2
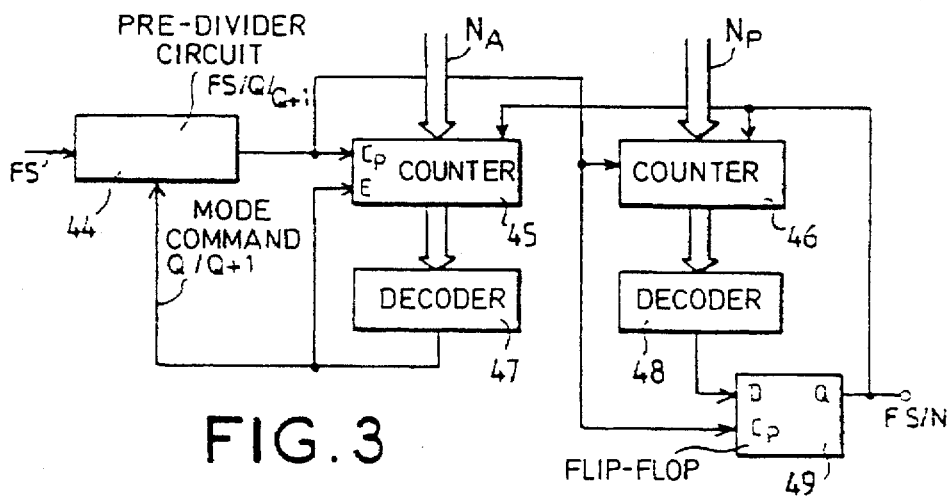
FIG.3
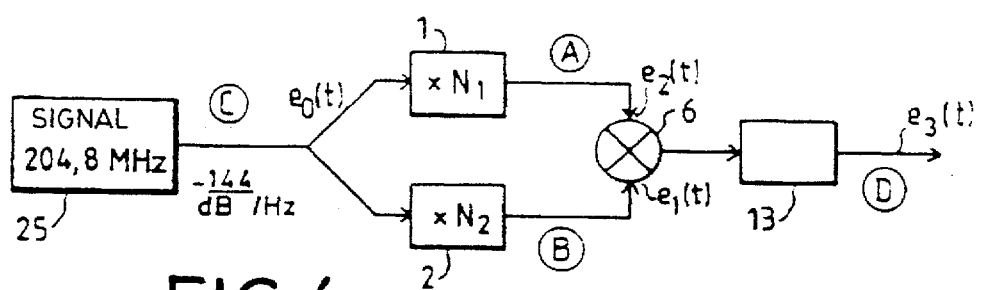
FIG.4

FREQUENCY SYNTHESIZER FOR V/UHF WIDEBAND RECEIVER

BACKGROUND OF THE INVENTION

The present invention relates to a frequency synthesizer for a wideband V/UHF receiver.

It can be applied particularly to the making of a V/UHF digital receiver in frequency-hopping mode in the 20 MHz–3 GHZ frequency range with a first high intermediate frequency that is higher than the highest of the frequencies that can be received by the receiver.

In these receivers, the fact of using a first intermediate frequency higher than the highest of the frequencies that can be received by the receiver has the advantage of simplifying the upline filtering between the reception antenna and the first frequency mixing stage. This approach however has the drawback of making the receivers highly sensitive to interference units, which may be very easily transposed into the reception band, when the noise band of the local oscillator that sends signals to the first mixing stage of the receiver is great or again when the frequency of this oscillator is not stable. These conditions then have a deleterious effect on spectral quality and, consequently, on the integrity of the signal demodulated by the receiver. In digital receivers, this deterioration of the signal which is restored by the demodulation system of the receiver is naturally a cause of error and of information loss.

To overcome these drawbacks, there is an approach already recommended by M. Wadley in 1954, described in an article, "Variable frequency crystal-controlled receivers and generators", in the journal, *The Transactions of the S.A. Institute of Electrical Engineers*. This approach consists of the heterodyne processing of the antenna signals with a variable frequency free oscillator to provide a first intermediate frequency, this same oscillator being subjected to heterodyne processing with a harmonic spectrum whose result is filtered by a narrow-band filter and then applied to a third mixer which furthermore receives the result of the first mixing. In this configuration, the drift and the phase noise of the variable frequency free oscillator is to a great extent eliminated. However, when this approach is applied to an RF wideband V/UHF receiver, it is subject to major difficulties of implementation, especially with respect to the first oscillator whose frequency stability must be greater than $10^{-3}$ as well as that of the passband filters which must meet very severe constraints as regards stability and limit values.

Furthermore, the lines of the spectrum generated by a harmonic generator give rise to noise because of variations in level of about 20 dB and to risks of pollution of the reception system owing to the fact that this spectrum is in the reception band.

SUMMARY OF THE INVENTION

The aim of the invention is to overcome the above-mentioned drawbacks.

To this end, an object of the invention is a frequency synthesizer for a wideband V/UHF receivers comprising a first frequency mixing stage to transpose the wideband signal applied to the receiver into a first intermediate frequency signal and a second frequency mixing stage coupled to the output of the first frequency mixing stage to transpose the first intermediate frequency signal into a second intermediate frequency signal, said device comprising a first frequency synthesizer loop with fractional division to apply a first wide frequency band transposition signal to an input of the first mixing stage, a second phase-lock frequency synthesizer for the application of a second narrow frequency band transposition signal to an input of the second mixing stage and a common frequency source coupled to the first loop and to the second loop to apply a frequency reference signal to their reference inputs.

An advantage of the invention is that it enables a fast synthesizing of frequency, for example between 4.5 and 7.5 GHz, with a very low phase noise of about –120 Dbc/Hz at ±3 dB at 20 KHz with respect to the carrier for very wideband V/UHF receivers.

BRIEF DESCRIPTION OF THE DRAWINGS

Other characteristics and advantages of the invention shall appear from the following description, made with reference to the appended drawings, of which:

FIG. 2 is a table illustrating a mode of dividing the frequencies of a receiver into four sub-ranges.

FIG. 3 shows an embodiment of the programmable frequency divider implemented in the embodiment of FIG. 1.

FIG. 4 is an equivalent simplified diagram of the embodiment of FIG. 1.

DESCRIPTION OF THE INVENTION

Figure 1:
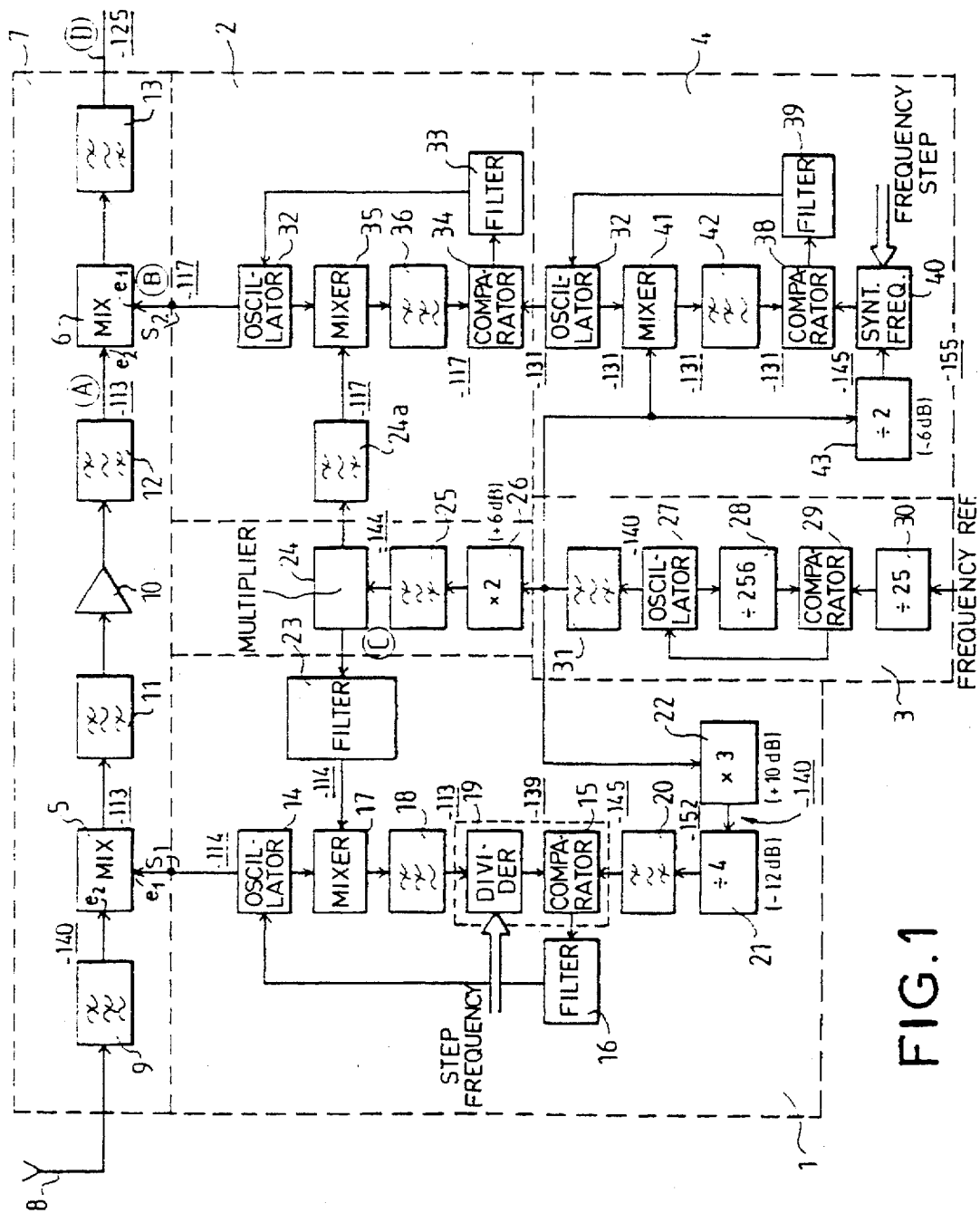
FIG. 1 shows an embodiment of a frequency synthesizer according to the invention applied to the making of a V/UHF wideband receiver.

The frequency synthesizer according to the invention shown in FIG. 1, has the following elements shown within boxes of dashes: a first frequency synthesizer loop 1 with fractional division and a second phase-lock frequency synthesizer loop 2. The signal setting the reference frequency of each of the loops 1 and 2 is obtained from a common source 3 that is a generator of a reference frequency with low phase noise. A third phase-lock loop 4 is positioned at the output of the reference source 3 for the application, to the input of the second loop 2, of a reference signal adapted to the operating characteristics of the second loop 2. The outputs $S_1$ and $S_2$ respectively of the first loop 1 and of the second loop 2 are respectively coupled to the inputs $e_1$ of a first stage 5 and a second frequency mixing stage 6 of an intermediate frequency reception system 7 of a wideband VHF/UHF radioelectric receiver. At a second input $e_2$, the mixing stage 5 receives a signal obtained at the output of an antenna 8 and filtered by means of a lowpass filter 9. The signal obtained at the output of the mixing stage 5 is applied to a second input $e_2$ of the mixing stage 6 after having been amplified by the intermediate frequency amplifier 10 interposed between two passband filters 11 and 12. A passband filter 13, centered on a second intermediate frequency, is positioned at output of the second mixing stage 6.

According to a preferred embodiment of the invention, the loop 1 enables the synthesizing of the frequencies in a very wideband ranging from 4.5 to 7.5 GHz with a synthesis step of 10 MHz and a loop 2 enables the synthesis of frequencies in a ±5 MHz band about a central frequency of 4.4 GHZ with a synthesis step of 25 KHz.

To achieve these results, the loop 1 is not made, as is conventionally the case for lower frequencies, by means of a loop formed by an oscillator that is voltage-controlled by the output of a phase/frequency comparator and a variable order divider whose order of division is fixed by the ratio between the frequency to be synthesized and a fixed reference frequency. This is because there is no variable order divider capable of working at frequencies as high as 7.5 GHz and because, assuming that such dividers exist, they could not be appropriate because their excessively high order of division would be the cause of an excessive level of phase noise brought to the output of the oscillator.

Using a different approach, the loop 1 has a variable frequency oscillator 14 voltage-controlled by a signal given by the output of a phase-frequency comparator 15 filtered by a band filter 16. The signal obtained at output of the oscillator 14 is applied, firstly, to an input $e_1$ of the mixing stage 5 and, secondly, to a first input of the phase comparator 15 after it has been successively transposed in frequency by a mixing stage 17, filtered by a lowpass filter 18 and then divided in frequency by a variable order divider 19 with fractional division. The second input of the phase comparator 15 receives the frequency reference signal from the loop 1.

This reference signal is obtained at the output of a passband filter 20 coupled to the output of the reference source 3 by means of a divider circuit 21 and a multiplier circuit 22. The transposition of the frequency of the oscillator 14 which is applied to the mixing stage 17 takes place by the application, to a second input of the mixing stage 17 and after filtering by a filter 23, of a signal given by the output of a dual frequency multiplier circuit 24 formed in a known way by a harmonic generator.

The input of the multiplier circuit 24 is coupled to the output of the frequency source 3 by means of a passband filter 25 and a multiplier by two referenced 26, the filter and the multiplier being series-connected in the order in which they have been mentioned.

The source 3 generating the reference frequency consists of a phase-lock loop formed in a known way by a voltage-controlled quartz oscillator 27, a frequency divider 28 and a phase/frequency comparator 29. The frequency reference applied at the input of the loop to the phase/frequency comparator 29 is obtained from an external reference source of frequency divided by a divider circuit 30. A quartz filter 31 is placed between the output of the oscillator 27 and the respective inputs of the multiplier circuits 22 and 26.

The synthesizer loop 2 has a oscillator 32 voltage-controlled by the output of a loop filter 33 positioned between the oscillator 32 and the output of a phase comparator 34.

A frequency transposition stage 35 is coupled by a first input between the output of the oscillator 32 and a first input of the phase comparator 34 by means of a filter 36 and by a second input to the output of the multiplier circuit 24 by means of the filter 24a. The second input of the phase comparator 34 is connected to the output of the third phase-lock loop 4. This third loop 4 gives a reference frequency signal to the second input of the phase/frequency comparator 34. It has an oscillator 37 voltage-controlled by the output of a phase/frequency comparator 38 through a filter 39. At a first input, the comparator 38 receives a reference frequency given by a digital frequency synthesizer 40 and at a second input it receives a transposed frequency of the frequency of the oscillator 37 by means of a mixing stage 41 which delivers this frequency through a filter 42. The frequency transposition in the mixer 41 is obtained by the mixing of the frequency of the oscillator 37 with the frequency given at the output of the filter 31 of the frequency source 3. The frequency synthesizer 40 is synchronized by the output of a divider stage 43 of the frequency given by the output of the filter 31.

To make the oscillator 14 of the loop 1 travel through the band of frequencies ranging from 4.5 to 7.5 GHz, this band is divided into sub-ranges of frequencies. This division is guided by the minimum ranking, for example N=6, that may be given to the variable order divider 19, by the maximum frequency of operation of the divider which may be estimated, as a function of current technological possibilities, at 1.7 to 2 GHz and by the transient mode of the oscillator 14 when it is acted upon by a frequency changing command.

The table of FIG. 2 illustrates a possible mode of dividing the frequencies into four sub-ranges. In this table:

$F_A$ designates the tuning frequency of the receiver (antenna frequency), $F_T$ is the frequency of transposition of the signal applied to the mixing stage 17 of the loop 1 obtained by multiplication of the reference frequency at 102.4 MHz given by the oscillator 27 of the common source 3, $F_{OL1}$ is the frequency synthesized by the oscillator 14, $F_{INDRV}$ designates the input frequency of the variable order divider 19.

The variable rank divider 19 with fractional division shown in FIG. 3 has, in a known way and as described in the patent FR 2 656 480, a Q/Q+1 modulo 2 pre-divider circuit 44 and two programmable synchronous counters 45 and 46 coupled to the output of the pre-divider circuit 44. The pre-divider circuit 44 is formed, for example, by a set of flip-flops mounted in a Johnson ring in which only Q+1 states are kept to enable the making of a Q and Q+1 modulo 2 divider. The frequency $F_S$ of the signal given by the output of the filter 18 in FIG. 1 is thus divided by Q or Q+1 by the pre-divider circuit 44. The signal resulting from this division is applied to the counting inputs of the counters 45 and 46 which are programmed at respective values $N_A$ and $N_P$ to carry out a simultaneous countdown from these values, from the very start of the cycle of division by Q+1 and so long as the number $N_A$ has not been counted down to zero by the counter 45. When this happens, the countdown by the counter 45 is stopped and the rank of division of the pre-divider 44 is positioned at Q by the output, from a decoder 47, of the zero state. This decoder 47 also activates the inhibition, at its input E, of the counter 45 and the loading of the mode of division of the pre-divider 44. At the instant of appearance of the state zero, there are (Q+1)x$N_A$ frequency pulses $F_S$ counted. The countdown of the number $N_P$ by the counter 46 continues up to the state 2 of the counter decoded by a decoder 48 placed at its output. The decoding of the state 2 is an information element pertaining to an end of the division cycle. This information element is synchronized with the leading edge of the output clock signal of the pre-divider 44 and activates the reloading of the counters 45 and 46 by means of a flip-flop 49 which changes its state in synchronism with this clock, at the initial value $N_A$ and $N_P$.

After the end-of-cycle instant, the counter 45 is again released, the pre-divider 44 is repositioned for a division by Q+1 and the cycle starts again. The total number N of frequency pulses $F_S$ counted during a division cycle is consequently:

$$N=(Q+1)N_A+(N_P-N_A)Q=Q\ N_P+N_A$$

One of the main valuable features of the synthesizer that has just been described is that it enables a substantial improvement of the phase noise at output of the intermediate frequency filter 13. This is particularly shown here below by means of the equivalent diagram of FIG. 4. Assuming that the synthesizer loops 1 and 2 that servo-control the oscillators 14 and 32 bring noises that are ever lower than the output noises from the filters 23 and 24a, since by design the phase noises at output of these filters are correlated in phase as coming from the same source 3, it follows that the noises of the oscillators 14 and 32 have the same levels as the noises coming from the filters 23 and 24a. Thus, if the reception system brings about no additional deterioration, the noise of the oscillator 14 is normally found again at (A) at the input $e_2$ of the mixing stage 6. The noise of the oscillator 32 is, for its part, applied at (B) to the input $e_1$ of the mixing stage 6. Referring to the diagram of FIG. 4, where the elements similar to those of FIG. 1 are shown with the same references, and assuming that the signal at (C) obtained at the output of the filter 25 has the following form:

$$e_0(t)=\cos(\omega_o t + m_o \sin \alpha \Omega t) \quad (1)$$

where $\omega_o$ is the pulsing of the original carrier given at the output of the filter 25 and $m_o$ sine $\Omega t$ represents the parasitic modulation formed by noise and lines.

If $N_1$ and $N_2$ designate the ratios of the frequencies synthesized by the oscillators 14 and 32 with the frequency given at output of the filter 25, the signals obtained at the points (A) and (B) then have the form $$e_1(t)=\cos(N_1\omega_o t + N_1 m_o \sin \Omega t) \quad (2)$$

$$e_2(t)=\cos(N_2\omega_o t + N_2 m_o \sin \Omega t) \quad (3)$$

After mixing and passband filtering of the frequency difference component through the mixer 6 and the stage 13, the signal obtained at (D) has the form:

$$e_3(t)=\tfrac{1}{2}\cos[(N_1-N_2)\omega_o t + (N_1-N_2)m_o \sin \Omega t] \quad (4)$$

The relationship (4) shows that the index of modulation of the original carrier is increased by the magnitude $N_1-N_2$, namely $20\log(N_1-N_2)$dB. This amounts to stating, assuming for purposes of simplification that there are no cases of non-linearity and no difference in delay between channels, that the phase noise of the signal available at (D) is equal to the phase noise of the signal at (C) downgraded by $20\log(N_1-N_2)$dB. Thus the phase noise obtained at (D) is lower than the lowest of the phase noises of the signals presented to the inputs of the mixer 6.

An example of the distribution of the noise levels in dBc/Hz is shown in FIG. 1, either by numbers in brackets indicating, a deterioration or a gain in terms of dB or by underlined numbers indicating the bottom limits of noise, especially as regards the phase comparators 15 and 34, of the variable rank divider 19 and of the direct synthesizer 35 for the following conditions of operation:

frequency of the antenna signal given by the output of the filter 9
=2018 MHz frequency of the transposition signal given by the output of the filter 23
=6144 MHz frequency of the signal given by the oscillator 14
=4684.8 MHz frequency applied to the input of the variable rank divider
=1459.2 MHz rank of division of the variable rank divider 19
=19 frequency of the signal obtained at output of the oscillator 32
=4413 MHz frequency of the signal obtained at output of the intermediate frequency signal 13
=70 MHz frequency of the reference signal applied to the input of the divider 30
=10 MHz ratio of division of the divider 30
=25 ratio of division of the divider 28
=256 frequency of the signal applied to the input of the multiplier 24
=204.8 MHz rank of multiplication $N_1$, (FIG. 4)
=30 rank of multiplication $N_2$ (FIG. 4)
=21 rank of multiplication of the multiplier 22
=3 rank of division of the divider 22
=4 frequency of the signal given by the oscillator 37
=112.2 MHz

All the values of the phase noise are indicated in FIG. 1 for a difference of 20 KHz with the carrier frequency of the corresponding signal.

The noise value obtained at output of the oscillator 14 is equal to −114 dBc/Hz. If there were no transposition of frequency performed by the mixing stage 17, the phase noise at output of the oscillator 14 will be equal to −119 dBc/Hz, namely equal to the bottom limit of noise of the phase comparator 15 to which it is necessary to add the quantity 20 log N where N is the rank of division of the variable rank divider 19. With N=19 and a bottom limit of noise of −145 dBc/Hz, the noise at 20 KHz is equal, under these conditions, to −145+20 log 19=−119 dBc/Hz. However, since the value of noise of the transposition signal obtained at output of the filter 23 is equal to −114 dBc/Hz and is greater than −119 dBc/Hz, it is the value −114 dBc/Hz of its own noise that is copied at output of the oscillator 14.

By estimating the noise of the loop 4 at −131 dBc/Hz, the same reasoning applied to the oscillator 32 makes it possible to obtain a noise of −117 dBc/Hz which is actually the preponderant noise to be considered. These noise values correspond to the noise of the transposition signal given by the output of transposition applied to the mixing stage 36.

Assuming that the reception system 7 induces no additional deterioration, the noise levels of the oscillators 14 and 27 are respectively found again at the inputs $e_2$ and $e_1$ of the mixer 6.

With the values $N_1=30$ and $N_2=21$, the index of modulation is increased by the magnitude $N_1-N_2$, that is $20\log(N_1-N_2)$dB. The noise at (D) at output of the intermediate frequency filter is equal to $-144+20\log(-30-21)=-125$ dBc/Hz.

What is claimed is:

1. A frequency synthesizer device configured for use in a wideband V/UHF receiver having a first frequency mixing stage configured to transpose a wideband signal applied to an input of the receiver into a first intermediate frequency signal and a second frequency mixing stage coupled to an output of the first frequency mixing stage and configured to transpose the first intermediate frequency signal into a second intermediate frequency signal, comprising;

a first frequency synthesizer loop with fractional division configured to apply a first frequency band transposition signal to an input of the first mixing stage, said first frequency synthesizer loop, comprising, a voltage controlled oscillator having an output configured to output said first frequency band transposition signal, a frequency mixing mechanism, and a variable rank divider with fractional division coupled to said output of said voltage controlled oscillator via said frequency mixing mechanism;

a second frequency synthesizer loop configured to apply a second frequency band transposition signal to an input of the second mixing stage; and a common frequency source configured to apply a frequency reference to respective inputs of the first frequency synthesizer loop and the second frequency synthesizer loop.

2. A device according to claim 1, wherein the first frequency synthesizer loop further comprises a phase/frequency comparator coupled to an output of the variable rank divider and to the common frequency source so as to servo-link the voltage controlled oscillator to a frequency proportional to the reference frequency of the common frequency source, wherein said variable rank divider is configured to transpose the first frequency band transposition signal applied to the frequency mixing stage into a lower frequency with another transposition signal derived from the reference signal given by the common frequency source.

3. A device according to claim 2, comprising a first multiplier circuit coupled between the frequency mixing stage and the common frequency source to give a transposition signal whose frequency is a multiple of the reference signal given by the common source.

4. A device according to claim 3, wherein the second frequency synthesizer loop comprises:

an voltage-controlled oscillator;

a phase/frequency comparator coupled by a first input to an output of the oscillator by means of a frequency mixing stage transposing the signal given by the oscillator into a lower frequency, to servo-link the oscillator with a frequency proportional to the reference frequency of the signal given by the common source.

5. A device according to claim 4, further comprising a second multiplier circuit coupled between the frequency mixing stage and the common frequency source to give a transposition signal whose frequency is a multiple of the frequency of the reference signal given by the common source.

6. A device according to claim 5, wherein the first multiplier circuit and the second multiplier circuit are formed by a generator of harmonics of the reference signal coupled to harmonic filters.

7. A device according to claim 6, wherein the common reference source comprises a voltage-controlled quartz oscillator coupled to a first input of a phase/frequency comparator by means of a frequency divider to servo-link the frequency of the oscillator with a frequency that is a multiple of a frequency of a reference signal applied to a second input of the phase comparator.

8. A device according to claim 7, wherein the second input of the phase/frequency comparator of the second frequency synthesizer loop is coupled to the output of a second phase-lock loop giving a frequency that is a multiple of the reference signal of the signal given by the common source.

9. A device according to claim 8, wherein the second phase-lock loop comprises a mixing stage interposed between the output of the oscillator and a first input of a phase comparator to control the frequency of the oscillator by comparing the frequency of the signal transposed by the mixing stage with the frequency of a reference signal that is a multiple of the frequency of the reference signal given by the common source and applied to its second input.

10. A device according to claim 9, wherein the signal applied to the second input of the phase comparator is given by direct digital synthesis.

11. A device according to claim 10, wherein the variable rank divider with fractional division comprises a Q/Q+1 modulo 2 pre-divider circuit and two programmable synchronous counters coupled to the output of the pre-divider circuit.

12. A device according to claim 1, wherein the first intermediate frequency is higher than the highest of the frequencies that can be received by the receiver.

* * * * *